United States Patent
Kale (10) Patent No.: US 12,175,126 B2
(45) Date of Patent: Dec. 24, 2024

(54) TECHNIQUES TO SEASON MEMORY CELLS

(71) Applicant: Micron Technology, Inc., Boise, ID (US)

(72) Inventor: Poorna Kale, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 190 days.

(21) Appl. No.: 17/652,412

(22) Filed: Feb. 24, 2022

(65) Prior Publication Data

US 2023/0266918 A1    Aug. 24, 2023

(51) Int. Cl.
*G06F 3/06*    (2006.01)

(52) U.S. Cl.
CPC .......... *G06F 3/0659* (2013.01); *G06F 3/0604* (2013.01); *G06F 3/0629* (2013.01); *G06F 3/0673* (2013.01)

(58) Field of Classification Search
CPC .... G06F 3/0659; G06F 3/0604; G06F 3/0629; G06F 3/0673; G11C 2029/5002; G11C 29/021; G11C 29/50; G11C 29/028; G11C 7/04
See application file for complete search history.

(56) References Cited

U.S. PATENT DOCUMENTS

| | | | | |
|---|---|---|---|---|
| 11,495,316 B1* | 11/2022 | Xie | .................... | G11C 29/028 |
| 11,797,190 B2* | 10/2023 | Muthiah | ............ | G06F 11/3034 |
| 2021/0090641 A1* | 3/2021 | Strand | ................ | G11C 16/3427 |
| 2022/0013185 A1* | 1/2022 | Xu | ......................... | G11C 29/50 |
| 2023/0236761 A1* | 7/2023 | Aiouaz | ................ | G06F 3/0659 |
| | | | | 711/154 |

\* cited by examiner

*Primary Examiner* — Charles Rones
*Assistant Examiner* — Alexander Vinnitsky
(74) *Attorney, Agent, or Firm* — Holland & Hart LLP (57) ABSTRACT

Methods, systems, and devices for techniques to season memory cells are described. A memory device may receive a command to season the memory device from a device configured to season the memory device or from a host device. Based on receiving the command, the memory device may identify a quantity of cycles to season the memory device based on receiving the command. In one case, the memory device may identify the quantity of cycles based on the command including an indication of the quantity of cycles used to season the memory device. In another case, the memory device may identify the quantity of cycles based on the command including one or more parameters associated with operating the memory device. In either case, the memory device may execute the quantity of cycles and indicate a completion of seasoning the memory device based on executing the quantity of cycles.

23 Claims, 5 Drawing Sheets

TECHNIQUES TO SEASON MEMORY CELLS

FIELD OF TECHNOLOGY

The following relates to one or more systems for memory, including techniques to season memory cells.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source. FeRAM may be able to achieve densities similar to volatile memory but may have non-volatile properties due to the use of a ferroelectric capacitor as a storage device.

DETAILED DESCRIPTION

When memory devices are initially manufactured, a reliability and retention of the memory device may be impacted by temperature. For example, memory cells of the memory device may fail to retain stored information when heated to certain temperatures. In some cases, the memory cells may become less susceptible to temperature-induced failures after extended use. Thus, manufacturing processes of these memory devices may include a seasoning the memory device, where the memory cells of the memory device are cycled (e.g., written to and erased from) until reaching a steadier state of performance when compared to the state of performance prior to the seasoning. In some cases, however, seasoning a memory device during the manufacturing process may be costly and time insensitive. Additionally, different amounts of seasoning may result in corresponding differences in performance of the memory device. Thus, seasoning the memory device during the manufacturing process may prevent customer-specific requirements and operating parameters to be considered when determining the amount to season the memory device.

Systems, techniques, and devices are described herein for seasoning memory cells of memory devices after the manufacturing process. That is, the memory device may be configured to execute a seasoning operation in response to a received command. For example, the memory device may receive the command to season the memory device from a host device. Additionally or alternatively, the memory device may receive the command via one or more input/output (I/O) pins prior to being coupled with a host device (e.g., from a device configured to season memory devices). In either case, the memory device may determine the amount of seasoning (e.g., the quantity of cycles) to perform based on receiving the command. For example, the command may indicate a quantity of cycles to execute during the seasoning of the memory device. In another example, the command may indicate one or more operating parameters associated with the memory device and the memory device may determine the quantity of cycles based on the one or more operating parameters. Based on determining the quantity of cycles, the memory device may perform the seasoning operation by executing the determined quantity of cycles. Thus, the memory device may be configured to perform the seasoning after the manufacturing process and in response to a command. Here, the seasoning may be less costly and time-intensive. Additionally, the amount of seasoning may be adjusted based on memory device-specific requirements and operating parameters.

Features of the disclosure are initially described in the context of systems and dies as described with reference to FIGS. 1 and 2. Features of the disclosure are described in the context of systems as described with reference to FIGS. 3A and 3B. These and other features of the disclosure are further illustrated by and described with reference to an apparatus diagram and flowcharts that relate to techniques to season memory cells as described with reference to FIGS. 4 and 5.

Figure 1:
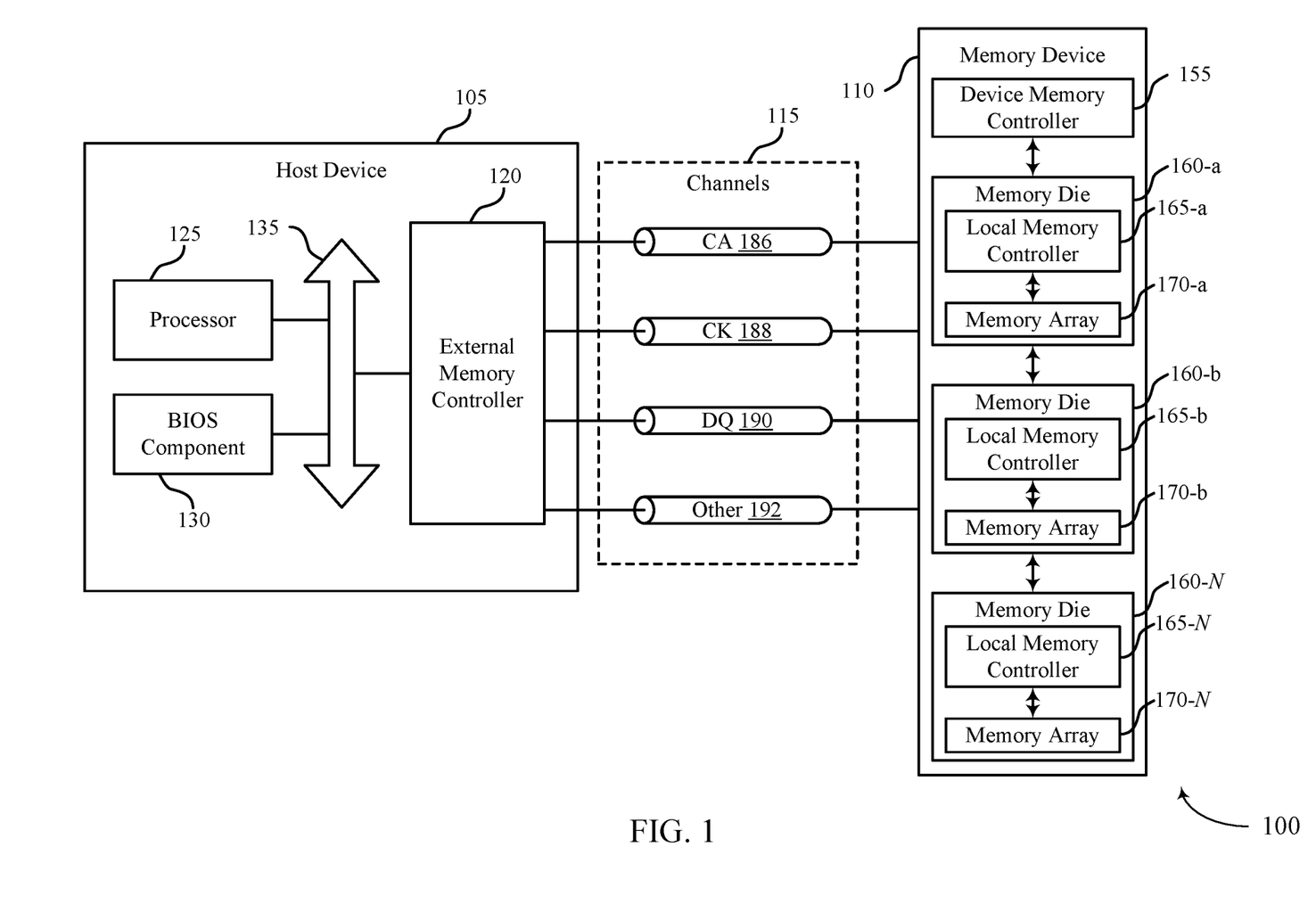
FIG. 1 illustrates an example of a system that supports techniques to season memory cells in accordance with examples as disclosed herein.

FIG. 1 illustrates an example of a system 100 that supports techniques to season memory cells in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

When the memory device 110 is initially manufactured, a reliability and retention of the memory device 110 may be impacted by temperature. For example, ferroelectric random access memory (FeRAM) memory cells in the memory array 170 may fail to retain stored information when heated to certain temperatures. In some cases, the memory cells in the memory arrays 170 may become less susceptible to temperature-induced failures after extended use. To improve the reliability and retention of the memory cells in the memory arrays 170, the memory device 110 may season the memory cells. For example, the memory device 110 may cycle the memory cells in the memory arrays 170 until the memory cells reach a steadier state of performance as compared with the state of performance prior to the seasoning. To perform each cycle of seasoning operation, the memory device 110 may execute a write operation on the memory cells followed by executing an erase operation on the memory cells. After executing a quantity of cycles on the memory cells of the memory arrays 170, the memory cells in the memory arrays 170 may have an improved retention and reliability when compared to the retention and reliability of the memory cells prior to the seasoning. Seasoning the memory cells, however, may reduce a quantity of cycles that a host device can use those memory cells to store data (e.g., reduce a life of the memory cells).

The memory device 110 may be configured to execute a seasoning operation in response to a received command. That is, the memory device 110 may determine the amount of seasoning (e.g., the quantity of cycles) to perform on the memory cells in the memory arrays 170 based on receiving the command. In one example, the command may indicate a quantity of cycles to execute during the seasoning of the memory device. In another example, the command may indicate one or more operating parameters associated with the memory device 110 and the memory device 110 may determine the quantity of cycles based on the one or more operating parameters. After determining the quantity of cycles, the memory device 110 may perform the seasoning operation by executing the determined quantity of cycles on the memory cells in the memory arrays 170.

The device memory controller 155 may include components (e.g., circuitry, logic) operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive information (e.g., data, commands, or both) from the host device 105. For example, the memory device 110 may receive a write command indicating that the memory device 110 is to store data for the host device 105 or a read command indicating that the memory device 110 is to provide data stored in a memory die 160 to the host device 105. In another example, the memory device 110 may receive a command to season the memory device 110 from the host device 105.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In another example, commands carried by the CA channel 186 may include a command to season the memory device 110. For example, the memory device 110 may receive the command to season the memory device 110 via one of the channels 115, such as the CA channel 186. Here, the memory device may determine the quantity of cycles to execute as part of the seasoning in response to receiving the command from the host device 105.

In some cases, a channel 115 may support communications between another device (e.g., other than the host device 105) and the memory device 110. For example, a channel 115 (e.g., including one or more pins or pads) may support communications between a device configured to season the memory device 110 and the memory device 110. Here, the memory device 110 may receive the command to season the memory device 110 from the device configured to season the memory device 110 via a channel. In response to receiving the command, the memory device 110 may determine the quantity of cycles to execute as part of the seasoning and execute the quantity of cycles. Thus, the memory device 110 may season the memory cells in the memory arrays 170 in response to a command received from the device configured to season the memory device 110. After the seasoning, the memory device 110 may be coupled with the host device 105 (e.g., via the channels 115). Then, the memory device 110 may communicate with the host device 105 using the channels 115. Here, the memory device 110 may communicate with the host device 105 using a same channel 115 previously utilized by the memory device 110 to receive the command to season the memory device 110 from the device configured to season the memory device 110.

Figure 2:
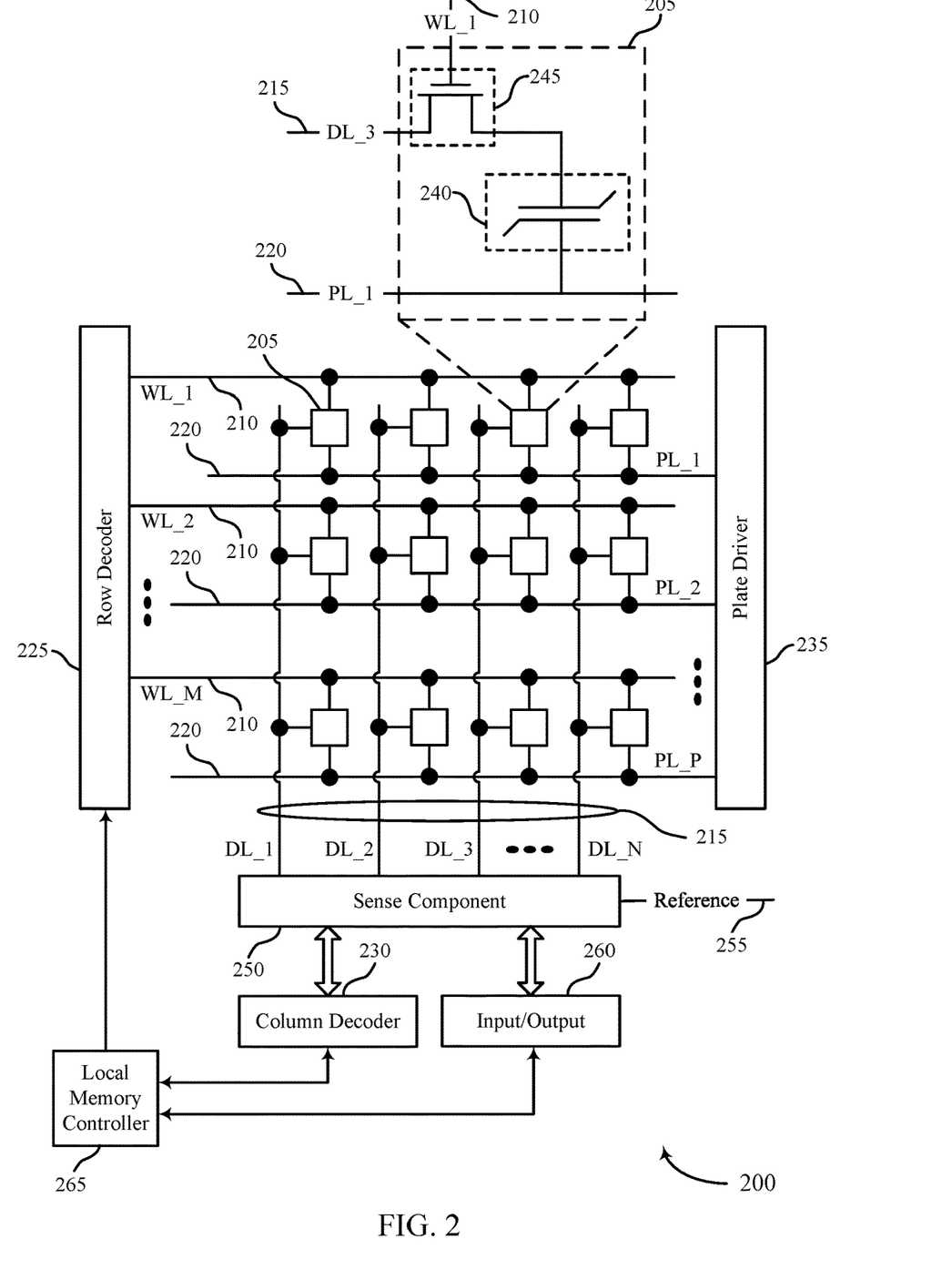
FIG. 2 illustrates an example of a memory die that supports techniques to season memory cells in accordance with examples as disclosed herein.

FIG. 2 illustrates an example of a memory die 200 that supports techniques to season memory cells in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245 (e.g., a cell selection component). The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

When the memory die 200 is initially manufactured, a reliability and retention of the memory cells 205 may be impacted by temperature. For example, FeRAM memory cells 205 may fail to retain stored information when heated to certain temperatures. In some cases, the memory cells 205 may become less susceptible to temperature-induced failures after extended use. To improve the reliability and retention of the memory cells 205, the memory cells 205 may be seasoned. For example, the local memory controller 265 may cycle the memory cells 205 until the memory cells 205 reach a steadier state of performance when compared to the state of performance of the memory cells 205 prior to the seasoning. To perform each cycle, the local memory controller 265 may execute a write operation on the memory cells 205 followed by an erase operation on the memory cells 205. After executing a quantity of cycles on the memory cells 205, the memory cells 205 may have an improved retention and reliability when compared to the retention and reliability of the memory cells 205 prior to the seasoning.

The memory die 200 may include access lines (e.g., word lines 210, digit lines 215, and plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding. Memory cells 205 may be positioned at intersections of the word lines 210, the digit lines 215, and/or the plate lines 220.

Operations such as reading and writing may be performed on memory cells 205 by activating access lines such as a word line 210, a digit line 215, or a plate line 220. By biasing a word line 210, a digit line 215, and a plate line 220 (e.g., applying a voltage to the word line 210, digit line 215, or plate line 220), a single memory cell 205 may be accessed at their intersection. The intersection of a word line 210 and a digit line 215 in a two-dimensional or in a three-dimensional configuration may be referred to as an address of a memory cell 205. Activating a word line 210, a digit line 215, or a plate line 220 may include applying a voltage to the respective line.

Accessing the memory cells 205 may be controlled through a row decoder 225, a column decoder 230, or a plate driver 235, or a combination thereof. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage). The detected logic state of the memory cell 205 may be provided as an output of the sense component 250 (e.g., to an input/output 260), and may indicate the detected logic state to another component of a memory device (e.g., a memory device 110) that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 265 may generate row signals and column address signals to activate the target word line 210, the target digit line 215, and the target plate line 220. The local memory controller 265 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a write operation (e.g., a programming operation) on one or more memory cells 205 of the memory die 200. During a write operation, a memory cell 205 of the memory die 200 may be programmed to store a desired state (e.g., logic state, charge state). The local memory controller 265 may identify a target memory cell 205 on which to perform the write operation. The local memory controller 265 may identify a target word line 210 and a target digit line 215 coupled with the target memory cell 205 (e.g., an address of the target memory cell 205). The local memory controller 265 may activate the target word line 210 and the target digit line 215 (e.g., applying a voltage to the word line 210 or digit line 215) to access the target memory cell 205. The local memory controller 265 may apply a signal (e.g., a write pulse, a write voltage) to the digit line 215 during the write operation to store a specific state (e.g., charge) in the capacitor 240 of the memory cell 205. The signal used as part of the write operation may include one or more voltage levels over a duration.

The local memory controller 265 may season the memory die 200 in response to receiving a command (e.g., from a host device, from a device configured to season the memory die 200). For example, the local memory controller 265 may identify a quantity of cycles to perform on the memory die 200 based on receiving the command. Then, the local memory controller 265 may perform the quantity of identified cycles, where each cycle includes the local memory controller 265 performing a write operation on the memory cells 205 of the memory die 200 followed by performing an erase operation on the memory cells 205 of the memory die 200.

Figure 3A:
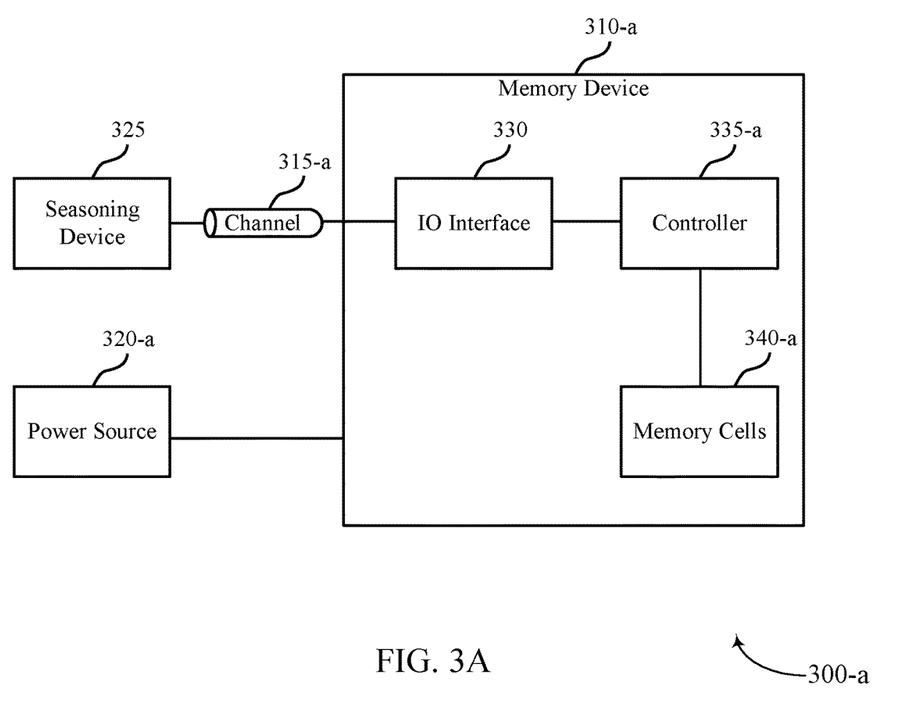
FIGS. 3A and 3B illustrate examples of systems that support techniques to season memory cells in accordance with examples as disclosed herein.
Figure 3B:
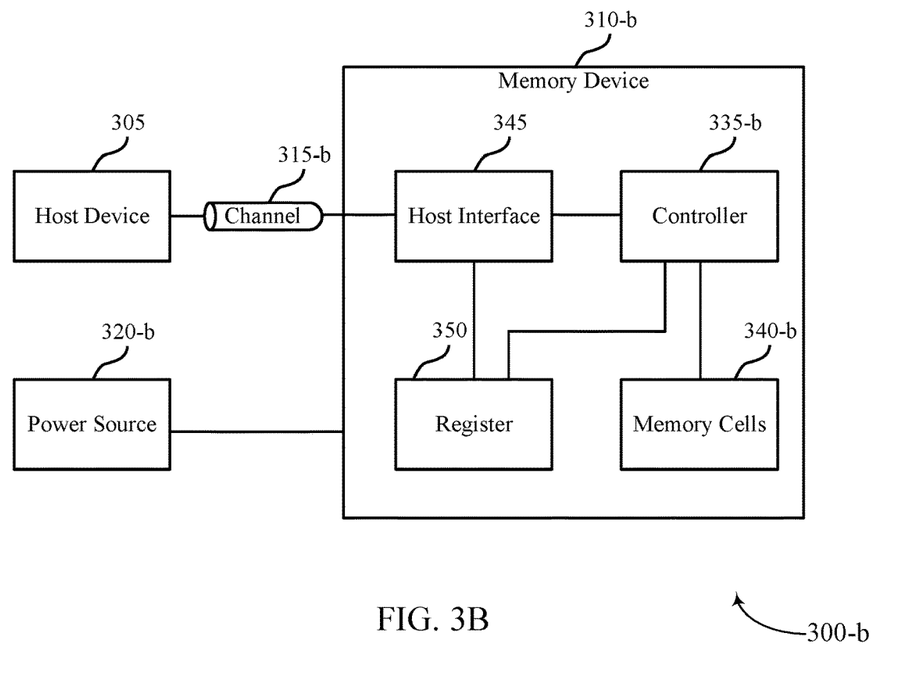

FIGS. 3A and 3B illustrate examples of systems 300 that support techniques to season memory cells in accordance with examples as disclosed herein. The systems 300 may include aspects of the system and memory die as described with reference to FIGS. 1 and 2. For example, the memory devices 310 may be examples of the memory device as described with reference to FIG. 1. Systems 300 may also include controllers 335, which may be examples of a device memory controller or local memory controller as described with reference to FIGS. 1 and 2. Additionally, the memory cells 340 may be examples of the memory cells as described with reference to FIG. 2.

In some cases, the reliability and retention of the memory cells 340 may be impacted by temperature. For example, the memory cells 340 may be FeRAM memory cells 340 that fail to retain stored information when heated to certain temperatures. Thus, the memory devices 310 may season the memory cells 340 to improve the retention and reliability of the memory cells 340. Specifically, FIG. 3A may illustrate an example of a memory device 310-a that seasons the memory cells 340-a in response to receiving a command from a seasoning device 325. Additionally, FIG. 3B may illustrate a memory device 310-b that seasons the memory cells 340-b in response to receiving a command from a host device 305. While not illustrated by system 300-a or system 300-b, some other systems 300 may include a memory device 310 configured to season the memory cells 340 in response to receiving a command from either the seasoning device 325 or the host device 305.

FIG. 3A may illustrate a system 300-a including a memory device 310-a coupled with a power source 320-a and a seasoning device 325. The seasoning device 325 may be any device configured to season the memory device 310-a prior to the memory device being coupled with a host device 305. That is, the seasoning device 325 may transmit a command to the memory device 310-a to season the memory device 310-a after a manufacturing of the memory device 310-a but prior to a coupling of the memory device 310-a with any host device 305.

The seasoning device 325 may communicate the command to season the memory device 310-a via a channel 315-a. The seasoning device 325 may be an example of a programmable state machine configured to configure the memory device 310-a, including by cycling the memory device 310-a. The channel 315-a may include or be coupled with an IO interface 330 at the memory device 310-a. The IO interface 330 may include one or more pins or pads at the memory device 310-a that may be coupled with the seasoning device 325 via the channel 315-a. In some cases, the pin associated with the channel 315-a (e.g., the IO interface 330) may be a dedicated pin (e.g., dedicated to receiving commands to season the memory device 310-a). For example, after the memory device 310-a seasons the memory cells 340-a in response to receiving the command from the seasoning device 325, the memory device 310-a may subsequently receive other communications (e.g., data, commands, clock signals) via the IO interface 330 (e.g., from a host device 305). In some other cases, the pin associated with the channel 315-a (e.g., the IO interface 330) may be utilized for communications with other devices (e.g., a host device 305) after communicating the command to season the memory device 310-a from the seasoning device 325 to the memory device 310-a. For example, the IO interface 330 may subsequently be used to communicate commands, addresses, clock signals, data, or other communications to or from the memory device 310-a.

The memory device 310-a may identify a quantity of cycles to season the memory cells 340-a based on receiving the command from the seasoning device 325. In one example, the seasoning device 325 may serially communicate the command to season the memory device 310-a and an indication of the quantity of cycles to execute at the memory device 310-a in order to season the memory cells 340-a. In another example, the seasoning device 325 may serially communicate the command to season the memory device 310-a and one or more parameters associated with operating the memory device 310-a and the memory device 310-a may identify the quantity of cycles based on the one or more parameters. For example, the memory device 310-a may execute an algorithm (e.g., that is stored at the controller 335-*a*) that receives an input of the one or more parameters and outputs a quantity of cycles to season the memory device 310-*a*. By utilizing one or more parameters associated with operating the memory device 310-*a* to identify the quantity of cycles to season the memory device 310-*a*, the memory device 310-*a* may identify an amount of seasoning of the memory cells 340-*a* that is based on operating conditions specific to the memory device 310-*a*. The parameters associated with operating the memory device 310-*a* may include one or more of a temperature range, a difference between a first temperature during a write operation and a second temperature during a read operation at the memory device 310-*a* (e.g., a differential temperature), an amount of time associated with operating the memory device 310-*a* in one or more temperatures, or a duration for retaining data at the memory device 310-*a*.

In one case where the seasoning device 325 transmits a temperature range associated with operating the memory device 310-*a* serially with the command to season the memory device 310-*a*, the memory device 310-*a* may identify the quantity of cycles to execute based on the temperature range. For example, the memory device 310-*a* may identify a larger quantity of cycles to season the memory device 310-*a* in cases that the temperature range is large or includes relatively high or low temperatures. Additionally, the memory device 310-*a* may identify a smaller quantity of cycles to season the memory device 310-*a* in cases that the temperature range is small or does not include relatively high or low temperatures. That is, the memory device 310-*a* may season the memory cells 340-*a* more, which may in turn result in a larger reliability and retention improvement of the memory cells 340-*a*, in cases that the seasoning device 325 indicates a larger operating temperature range when compared to cases that the seasoning device 325 indicates a smaller operating temperature range.

In another case where the seasoning device 325 transmits a difference between a first temperature during a write operation and a second temperature during a read operation, the memory device 310-*a* may identify the quantity of cycles to execute based on the differential between the temperatures. For example, if the difference between a temperature of the memory device 310-*a* during a write operation and a temperature of the memory device 310-*a* during a read operation is relatively large, the memory device 310-*a* may identify a larger quantity of cycles to season the memory device 310-*a*. Additionally, if the difference between a temperature of the memory device 310-*a* during a write operation and a temperature of the memory device 310-*a* during a read operation is relatively small, the memory device 310-*a* may identify a smaller quantity of cycles to season the memory device 310-*a*. That is, the memory device 310-*a* may season the memory cells 340-*a* more, which may in turn result in a larger reliability and retention improvement of the memory cells 340-*a*, in cases that the seasoning device 325 indicates a larger differential temperature (e.g., between the temperature at a write operation and a temperature at a read operation of the same location) when compared to cases that the seasoning device 325 indicates a smaller differential temperature.

In another case where the seasoning device 325 transmits a duration for retaining data at the memory device 310-*a*, the memory device 310-*a* may identify the quantity of cycles to execute based on duration for retaining the data. For example, if the duration for retaining the data is relatively large, the memory device 310-*a* may identify a larger quantity of cycles to season the memory device 310-*a*. Additionally, if the duration for retaining the data is relatively small, the memory device 310-*a* may identify a smaller quantity of cycles to season the memory device 310-*a*. That is, the memory device 310-*a* may season the memory cells 340-*a* more, which may in turn result in a larger reliability and retention improvement of the memory cells 340-*a*, in cases that the seasoning device 325 indicates a longer duration for retaining data at the memory device 310-*a* when compared to cases that the seasoning device 325 indicates a shorter duration for retaining data at the memory device 310-*a*.

The seasoning device 325 may update the algorithm executed by the memory device 310-*a* to identify the quantity of cycles to season the memory device 310-*a*. For example, the seasoning device 325 may transmit a command to the memory device 310-*a* to update the algorithm. Then, when the memory device 310-*a* receives a command to season the memory device 310-*a*, the memory device 310-*a* may execute the updated algorithm to identify the quantity of cycles to season the memory device 310-*a*.

In response to identifying the quantity of cycles to season the memory cells 340-*a*, the memory device 310-*a* may execute the quantity of identified cycles at the memory cells 340-*a*. In order to execute each identified cycle, the controller 335-*a* may perform a write operation on the memory cells 340-*a* followed by an erase operation on the memory cells 340-*a*. In some instances, the controller 335-*a* may include a programmable state machine that cycles the memory cells 340-*a* until the memory device 310-*a* has executed the identified quantity of cycles.

Based on executing the identified quantity of cycles indicated by the command (e.g., received from the seasoning device 325), the memory device 310-*a* may indicate a completion of seasoning the memory cells 340-*a* at the memory device 310-*a*. For example, the memory device 310-*a* may adjust a power supplied to the channel 315-*a* via the IO interface 330. In one case, the memory device 310-*a* may adjust the power by supplying power to the channel 315-*a* via the IO interface 330 upon completion of seasoning the memory device 310-*a*. Here, the memory device 310-*a* may not supply any power to the channel 315-*a* via the TO interface 330 while performing the seasoning of the memory device 310-*a*, but may supply power to the channel 315-*a* via the IO interface 330 upon a completion of seasoning the memory device 310-*a*. In another case, the memory device 310-*a* may supply power to the channel 315-*a* via the IO interface 330 while performing the seasoning of the memory device 310-*a*, and may not supply power to the channel 315-*a* via the IO interface 330 upon a completion of seasoning the memory device 310-*a*.

In some cases, the seasoning device 325 may include a light emitting diode (LED). The LED may indicate whether the memory device 310-*a* is executing the quantity of cycles to season the memory device 310-*a* or whether the memory device 310-*a* has completed seasoning the memory device. For example, the LED may be off (e.g., deactivated) while the memory device 310-*a* performs the seasoning and may be on (e.g., activated) in response to the memory device completing the seasoning (e.g., based on the memory device 310-*a* supplying power to the channel 315-*a* via the TO interface 330). In another example, the LED may be on (e.g., activated) while the memory device 310-*a* performs the seasoning based on the memory device 310-*a* supplying power to the channel 315-*a* via the IO interface 330 while executing the quantity of cycles. Additionally, the LED may be off (e.g., deactivated) in response to the memory device completing the seasoning based on the memory device 310-*a* not supplying power to the channel 315-*a* via the IO interface 330 once the memory device 310-*a* completes the seasoning.

After completing the seasoning of the memory device 310-*a*, the memory device 310-*a* may be decoupled from the seasoning device 325. Then, the memory device 310-*a* may be coupled with a host device (e.g., as described with reference to FIG. 1). The memory device 310-*a* may then operate based on receiving and transmitting communications with the host device as described with reference to FIGS. 1 and 2.

FIG. 3B may illustrate a system 300-*b* including a memory device 310-*b* coupled with a power source 320-*b* and a host device 305. The host device 305 may be an example of a host device as described with reference to FIG. 1. The host device 305 may communicate the command to season the memory device 310-*b* via a channel 315-*b*. The channel 315-*b* may include or be coupled with a host interface 345 at the memory device 310-*b*. The host interface 345 may include one or more pins or pads at the memory device 310-*b* that may be coupled with the host device 305 via the channel 315-*b*. In some cases, the channel 315-*b* may be an example of a CA channel 186, a DQ channel 190, or another channel 192 as described with reference to FIG. 1.

The memory device 310-*b* may identify a quantity of cycles to season the memory cells 340-*b* based on receiving the command from the host device 305. In one example, the host device 305 may communicate the quantity of cycles to execute at the memory device 310-*b* in order to season the memory cells 340-*b* (e.g., with the command to season the memory device 310-*b*). In another example, the host device 305 may communicate one or more parameters associated with operating the memory device 310-*b* and the memory device 310-*b* may identify the quantity of cycles based on the one or more parameters. For example, the memory device 310-*b* may execute an algorithm (e.g., stored at the controller 335-*b*) that receives an input of the one or more parameters and outputs a quantity of cycles to season the memory device 310-*b*. By utilizing one or more parameters associated with operating the memory device 310-*b* to identify the quantity of cycles to season the memory device 310-*b*, the memory device 310-*b* may identify an amount of seasoning of the memory cells 340-*b* that is based on operating conditions specific to the memory device 310-*b*.

The parameters associated with operating the memory device 310-*b* may include one or more of a temperature range, a difference between a first temperature during a write operation and a second temperature during a read operation at the memory device 310-*b* (e.g., a differential temperature), an amount of time associated with operating the memory device 310-*b* in one or more temperatures, or a duration for retaining data at the memory device 310-*b*. In one case where the host device 305 transmits a temperature range associated with operating the memory device 310-*b* with the command to season the memory device 310-*b*, the memory device 310-*b* may identify the quantity of cycles to execute based on the temperature range. In another case where the host device 305 transmits a difference between a first temperature during a write operation and a second temperature during a read operation, the memory device 310-*b* may identify the quantity of cycles to execute based on the differential temperature. In another case where the host device 305 transmits a duration for retaining data at the memory device 310-*b*, the memory device 310-*b* may identify the quantity of cycles to execute based on duration for retaining the data.

The host device 305 may update the algorithm executed by the memory device 310-*b* to identify the quantity of cycles to season the memory device 310-*b*. For example, the host device 305 may transmit a command to the memory device 310-*b* to update the algorithm. Then, in response to the memory device 310-*b* receiving a command to season the memory device 310-*b*, the memory device 310-*b* may execute the updated algorithm to identify the quantity of cycles to season the memory device 310-*b*.

In response to identifying the quantity of cycles to season the memory cells 340-*b*, the memory device 310-*b* may execute the quantity of identified cycles at the memory cells 340-*b*. In order to execute each identified cycle, the controller 335-*b* may perform a write operation on the memory cells 340-*b* followed by an erase operation on the memory cells 340-*b*. In some instances, the controller 335-*b* may include a programmable state machine that cycles the memory cells 340-*b* until the memory device 310-*b* has executed the identified quantity of cycles.

The memory device 310-*b* may indicate, to the host device 305, a status of seasoning the memory device 310-*b* (e.g., in response to receiving the command to season the memory device 310-*b* from the host device 305). For example, the memory device 310-*b* may set the register 350 to a value that indicates the status of seasoning the memory device 310-*b*. In one case, the memory device 310-*b* may set the register 350 to a value indicating a completion of seasoning the memory device 310-*b* in response to completing an execution of the identified quantity of cycles on the memory cells 340-*b*. Additionally, the memory device 310-*b* may set the register 350 to a value indicating a status of executing the identified quantity of cycles. For example, the memory device 310-*b* may set the register 350 to values indicating a percentage or portion of the quantity of cycles that have been executed on the memory cells 340-*b* during the seasoning of the memory device 310-*b*. Here, the memory device 310-*b* may set the register 350 to the values periodically during the seasoning of the memory device 310-*b* or in response to completing a predefined portion or percentage of the identified quantity of cycles.

The memory device 310-*b* may additionally set the register 350 to a value indicating an error associated with seasoning the memory device 310-*b*. For example, the memory device 310-*b* may fail to execute one or more of the identified quantity of cycles on the memory cells 340-*b*. Here, the memory device 310-*b* may determine that an error occurred during the seasoning of the memory device 310-*b*. In response to determining that the error occurred, the memory device 310-*b* may set the register 350 to the value indicating the error associated with seasoning the memory device 310-*b*. The host device 305 may read the register 350 and identify the error associated with seasoning the memory device 310-*b*. In some cases, the host device 305 may transmit a second command to season the memory device 310-*b* in response to identifying the error. For example, the host device 305 may determine that a portion of the cycles indicated by the command to season the memory device 310-*b* were completed (e.g., and a second portion of the cycles indicated by the command to season the memory device 310-*b* were not completed due to the error). Here, the host device 305 may transmit the second command to season the memory device 310-*b* indicating the second portion of cycles. Then, the memory device 310-*b* may identify a second quantity of cycles equal to the second portion of cycles (e.g., not completed during the first seasoning of the memory device 310-*b* due to the error) and execute the second quantity of cycles based on receiving the second command.

After the memory device 310-*b* indicates the completion of seasoning the memory device 310-*b*, the memory device 310-*b* may operate based on receiving and transmitting communications with the host device 305 as described with reference to FIGS. 1 and 2.

Figure 4:
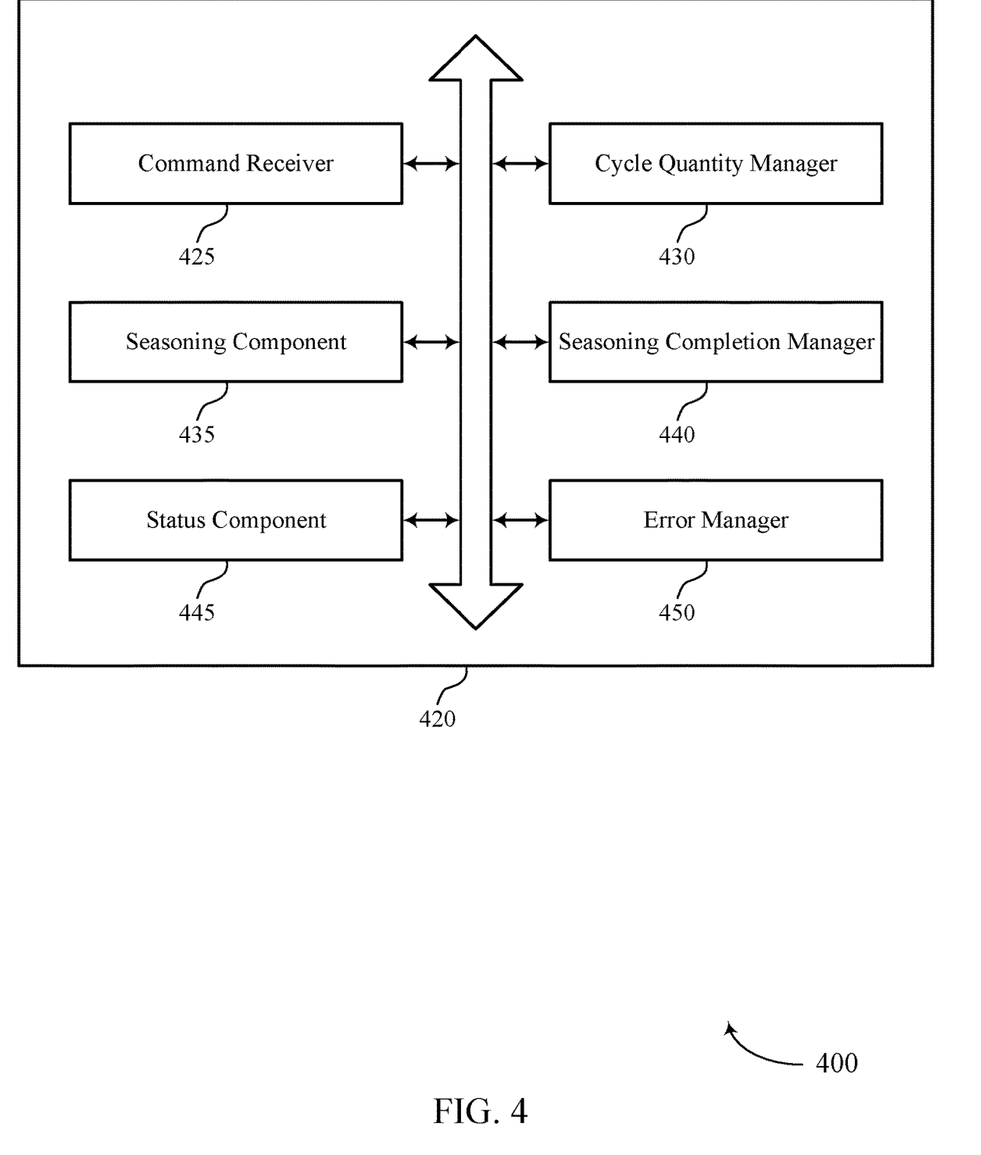
FIG. 4 shows a block diagram of a memory device that supports techniques to season memory cells in accordance with examples as disclosed herein.

FIG. 4 shows a block diagram 400 of a memory device 420 that supports techniques to season memory cells in accordance with examples as disclosed herein. The memory device 420 may be an example of aspects of a memory device as described with reference to FIGS. 1 through 3. The memory device 420, or various components thereof, may be an example of means for performing various aspects of techniques to season memory cells as described herein. For example, the memory device 420 may include a command receiver 425, a cycle quantity manager 430, a seasoning component 435, a seasoning completion manager 440, a status component 445, an error manager 450, or any combination thereof. Each of these components may communicate, directly or indirectly, with one another (e.g., via one or more buses).

The command receiver 425 may be configured as or otherwise support a means for receiving a command to season a memory device. The cycle quantity manager 430 may be configured as or otherwise support a means for identifying a quantity of cycles to season the memory device based at least in part on receiving the command, each cycle including performing a write operation and an erase operation on memory cells of the memory device. The seasoning component 435 may be configured as or otherwise support a means for executing the quantity of cycles indicated by the command based at least in part on the identifying. The seasoning completion manager 440 may be configured as or otherwise support a means for indicating a completion of seasoning the memory device based at least in part on executing the quantity of cycles.

In some examples, to support receiving the command, the command receiver 425 may be configured as or otherwise support a means for receiving the command from a device configured to season the memory device.

In some examples, the command is received from the device configured to season the memory device via a pin at the memory device. In some examples, indicating the completion includes adjusting a voltage supplied to the pin of the memory device.

In some examples, the status component 445 may be configured as or otherwise support a means for indicating that the memory device is executing the quantity of cycles by supplying a first voltage to the pin, where adjusting the voltage includes adjusting the voltage supplied to the pin from the first voltage to a second voltage.

In some examples, receiving the command includes receiving the command from a host device. In some examples, indicating the completion includes indicating the completion to the host device.

In some examples, the command includes one or more parameters associated with operating the memory device. In some examples, identifying the quantity of cycles is based at least in part on the one or more parameters.

In some examples, the one or more parameters include a temperature range, a difference between a first temperature during a write operation and a second temperature during a read operation at the memory device, an amount of time associated with operating the memory device in one or more temperatures, a duration for retaining data at the memory device, or a combination thereof.

In some examples, the command includes the quantity of cycles to season the memory device.

In some examples, to support indicating the completion, the seasoning completion manager 440 may be configured as or otherwise support a means for setting a register to a value indicating the completion of seasoning the memory device.

In some examples, the status component 445 may be configured as or otherwise support a means for indicating a status of executing at least a portion of the quantity of cycles prior to indicating the completion of seasoning the memory device.

In some examples, to support indicating the status, the status component 445 may be configured as or otherwise support a means for setting a register to a value indicating a second quantity of the cycles executed prior to indicating the status or a percentage of the quantity of the cycles executed prior to indicating the status.

In some examples, the error manager 450 may be configured as or otherwise support a means for failing to execute one of the quantity of cycles indicated by the command. In some examples, the error manager 450 may be configured as or otherwise support a means for indicating an error associated with seasoning the memory device based at least in part on the failing, where indicating the completion of seasoning the memory device is based at least in part on indicating the error.

Figure 5:
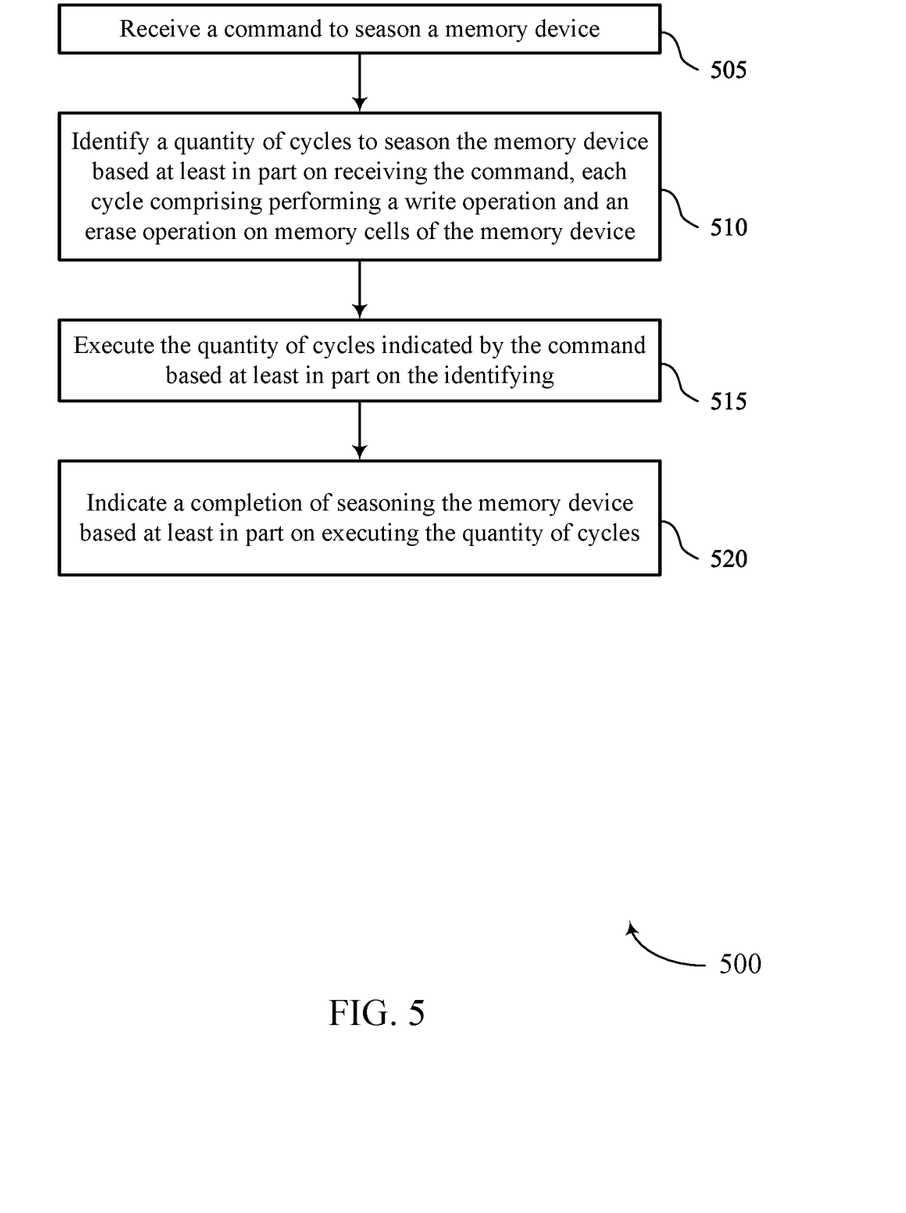
FIG. 5 shows a flowchart illustrating a method or methods that support techniques to season memory cells in accordance with examples as disclosed herein.

FIG. 5 shows a flowchart illustrating a method 500 that supports techniques to season memory cells in accordance with examples as disclosed herein. The operations of method 500 may be implemented by a memory device or its components as described herein. For example, the operations of method 500 may be performed by a memory device as described with reference to FIGS. 1 through 4. In some examples, a memory device may execute a set of instructions to control the functional elements of the device to perform the described functions. Additionally or alternatively, the memory device may perform aspects of the described functions using special-purpose hardware.

At 505, the method may include receiving a command to season a memory device. The operations of 505 may be performed in accordance with examples as disclosed herein. In some examples, aspects of the operations of 505 may be performed by a command receiver 425 as described with reference to FIG. 4.

At 510, the method may include identifying a quantity of cycles to season the memory device based at least in part on receiving the command, each cycle including performing a write operation and an erase operation on memory cells of the memory device. The operations of 510 may be performed in accordance with examples as disclosed herein. In some examples, aspects of the operations of 510 may be performed by a cycle quantity manager 430 as described with reference to FIG. 4.

At 515, the method may include executing the quantity of cycles indicated by the command based at least in part on the identifying. The operations of 515 may be performed in accordance with examples as disclosed herein. In some examples, aspects of the operations of 515 may be performed by a seasoning component 435 as described with reference to FIG. 4.

At 520, the method may include indicating a completion of seasoning the memory device based at least in part on executing the quantity of cycles. The operations of 520 may be performed in accordance with examples as disclosed herein. In some examples, aspects of the operations of 520 may be performed by a seasoning completion manager 440 as described with reference to FIG. 4.

In some examples, an apparatus as described herein may perform a method or methods, such as the method 500. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving a command to season a memory device; identifying a quantity of cycles to season the memory device based at least in part on receiving the command, each cycle including performing a write operation and an erase operation on memory cells of the memory device; executing the quantity of cycles indicated by the command based at least in part on the identifying; and indicating a completion of seasoning the memory device based at least in part on executing the quantity of cycles.

Aspect 2: The method, apparatus, or non-transitory computer-readable medium of aspect 1 where receiving the command includes operations, features, circuitry, logic, means, or instructions, or any combination thereof for receiving the command from a device configured to season the memory device.

Aspect 3: The method, apparatus, or non-transitory computer-readable medium of aspect 2 where the command is received from the device configured to season the memory device via a pin at the memory device and indicating the completion includes adjusting a voltage supplied to the pin of the memory device.

Aspect 4: The method, apparatus, or non-transitory computer-readable medium of aspect 3, further including operations, features, circuitry, logic, means, or instructions, or any combination thereof for indicating that the memory device is executing the quantity of cycles by supplying a first voltage to the pin, where adjusting the voltage includes adjusting the voltage supplied to the pin from the first voltage to a second voltage.

Aspect 5: The method, apparatus, or non-transitory computer-readable medium of any of aspects 1 through 4 where receiving the command includes receiving the command from a host device and indicating the completion includes indicating the completion to the host device.

Aspect 6: The method, apparatus, or non-transitory computer-readable medium of any of aspects 1 through 5 where the command includes one or more parameters associated with operating the memory device and identifying the quantity of cycles is based at least in part on the one or more parameters.

Aspect 7: The method, apparatus, or non-transitory computer-readable medium of aspect 6 where the one or more parameters include a temperature range, a difference between a first temperature during a write operation and a second temperature during a read operation at the memory device, an amount of time associated with operating the memory device in one or more temperatures, a duration for retaining data at the memory device, or a combination thereof.

Aspect 8: The method, apparatus, or non-transitory computer-readable medium of any of aspects 1 through 7 where the command includes the quantity of cycles to season the memory device.

Aspect 9: The method, apparatus, or non-transitory computer-readable medium of any of aspects 1 through 8 where indicating the completion, further includes operations, features, circuitry, logic, means, or instructions, or any combination thereof for setting a register to a value indicating the completion of seasoning the memory device.

Aspect 10: The method, apparatus, or non-transitory computer-readable medium of any of aspects 1 through 9, further including operations, features, circuitry, logic, means, or instructions, or any combination thereof for indicating a status of executing at least a portion of the quantity of cycles prior to indicating the completion of seasoning the memory device.

Aspect 11: The method, apparatus, or non-transitory computer-readable medium of aspect 10 where indicating the status includes operations, features, circuitry, logic, means, or instructions, or any combination thereof for setting a register to a value indicating a second quantity of the cycles executed prior to indicating the status or a percentage of the quantity of the cycles executed prior to indicating the status.

Aspect 12: The method, apparatus, or non-transitory computer-readable medium of any of aspects 1 through 11, further including operations, features, circuitry, logic, means, or instructions, or any combination thereof for failing to execute one of the quantity of cycles indicated by the command and indicating an error associated with seasoning the memory device based at least in part on the failing, where indicating the completion of seasoning the memory device is based at least in part on indicating the error.

It should be noted that the methods described herein are possible implementations, and that the operations and the steps may be rearranged or otherwise modified and that other implementations are possible. Furthermore, portions from two or more of the methods may be combined.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    receiving a command to season a memory device, the command indicating one or more parameters associated with operating the memory device;
    identifying, based at least in part on the one or more parameters associated with operating the memory device, a quantity of cycles to season the memory device prior to executing the quantity of cycles, each cycle comprising performing a write operation and an erase operation on memory cells of the memory device;
    executing the quantity of cycles indicated by the command based at least in part on the identifying; and
    indicating, to an external device, a completion of seasoning the memory device based at least in part on executing the quantity of cycles.

2. The method of claim 1, wherein receiving the command comprises:
    receiving the command from the external device that is configured to season the memory device.

3. The method of claim 2, wherein:
    the command is received from the external device configured to season the memory device via a pin at the memory device; and
    indicating the completion comprises adjusting a voltage supplied to the pin of the memory device.

4. The method of claim 3, further comprising:
    indicating that the memory device is executing the quantity of cycles by supplying a first voltage to the pin, wherein adjusting the voltage comprises adjusting the voltage supplied to the pin from the first voltage to a second voltage.

5. The method of claim 1, wherein:
    receiving the command comprises receiving the command from a host device; and
    indicating the completion comprises indicating the completion to the host device.

6. The method of claim 1, wherein the one or more parameters comprise a temperature range, a difference between a first temperature during a write operation and a second temperature during a read operation at the memory device, an amount of time associated with operating the memory device in one or more temperatures, a duration for retaining data at the memory device, or a combination thereof.

7. The method of claim 1, wherein the command comprises the quantity of cycles to season the memory device.

8. The method of claim 1, wherein indicating the completion further comprises:
    setting a register to a value indicating the completion of seasoning the memory device.

9. The method of claim 1, further comprising:
    indicating a status of executing at least a portion of the quantity of cycles prior to indicating the completion of seasoning the memory device.

10. The method of claim 9, wherein indicating the status comprises:
    setting a register to a value indicating a second quantity of the cycles executed prior to indicating the status or a percentage of the quantity of the cycles executed prior to indicating the status.

11. The method of claim 1, further comprising:
    failing to execute one of the quantity of cycles indicated by the command; and
    indicating an error associated with seasoning the memory device based at least in part on the failing, wherein indicating the completion of seasoning the memory device is based at least in part on indicating the error.

12. A memory system, comprising:
    a plurality of memory cells; and
    one or more controllers coupled with the plurality of memory cells and configured to:
        receive a command to season the memory system, the command indicating one or more parameters associated with operating the memory system;
        identify, based at least in part on the one or more parameters associated with operating the memory system, a quantity of cycles to season the memory system prior to executing the quantity of cycles, each cycle comprising performing a write operation and an erase operation on the plurality of memory cells of the memory system;
        execute the quantity of cycles indicated by the command based at least in part on the identifying; and
        indicate, to an external device, a completion of seasoning the memory system based at least in part on executing the quantity of cycles.

13. The memory system of claim 12, wherein to receive the command the one or more controllers are further configured to:
    receive the command from the external device that is configured to season the memory system.

14. The memory system of claim 13, further comprising:
    a pin coupled with the one or more controllers, wherein:
        the command is received from the external device configured to season the memory system via the pin; and
        to indicate the completion the one or more controllers are further configured to adjust a voltage supplied to the pin.

15. The memory system of claim 14, wherein the one or more controllers are further configured to:
    indicate that the memory system is executing the quantity of cycles by supplying a first voltage to the pin, wherein adjusting the voltage comprises adjusting the voltage supplied to the pin from the first voltage to a second voltage.

16. The memory system of claim 12, further comprising:
    an interface in electronic communication with a host device, the interface configured to:
        receive the command from the host device; and
        indicate the completion to the host device.

17. The memory system of claim 12, wherein the command comprises the quantity of cycles to season the memory system.

18. The memory system of claim 12, further comprising:
a register coupled with the one or more controllers, wherein to indicate the completion the one or more controllers are further configured to:
set the register to a value indicating the completion of seasoning the memory system.

19. The memory system of claim 12, wherein the one or more controllers are further configured to:
indicate a status of executing at least a portion of the quantity of cycles prior to indicating the completion of seasoning the memory system.

20. The memory system of claim 19, further comprising:
a register coupled with the one or more controllers, wherein to indicate the status the one or more controllers are further configured to:
set the register to a value indicating a second quantity of the cycles executed prior to indicating the status or a percentage of the quantity of the cycles executed prior to indicating the status.

21. A non-transitory computer-readable medium storing code, the code comprising instructions executable by a processor to:
receive a command to season a memory device, the command indicating one or more parameters associated with operating the memory device;
identify, based at least in part on the one or more parameters associated with operating the memory device, a quantity of cycles to season the memory device prior to executing the quantity of cycles, each cycle comprising performing a write operation and an erase operation on memory cells of the memory device;
execute the quantity of cycles indicated by the command based at least in part on the identifying; and
indicate, to an external device, a completion of seasoning the memory device based at least in part on executing the quantity of cycles.

22. The non-transitory computer-readable medium of claim 21, wherein the instructions to receive the command are executable by the processor to:
receive the command from the external device that is configured to season the memory device.

23. The non-transitory computer-readable medium of claim 21, wherein:
receiving the command comprises receiving the command from a host device; and
indicating the completion comprises indicating the completion to the host device.

* * * * *